(12) United States Patent
Tanahashi

(10) Patent No.: US 6,184,477 B1
(45) Date of Patent: Feb. 6, 2001

(54) MULTI-LAYER CIRCUIT SUBSTRATE HAVING ORTHOGONAL GRID GROUND AND POWER PLANES

(75) Inventor: Shigeo Tanahashi, Kyoto (JP)

(73) Assignee: Kyocera Corporation, Kyoto (JP)

( * ) Notice: Under 35 U.S.C. 154(b), the term of this patent shall be extended for 0 days.

(21) Appl. No.: 09/204,136

(22) Filed: Dec. 2, 1998

(51) Int. Cl.[7] .............................. H01R 12/04; H05K 1/11
(52) U.S. Cl. ............................................ 174/261; 174/262
(58) Field of Search .................................... 174/255, 261, 174/262; 361/780, 784, 792, 793, 794, 795, 799, 800

(56) References Cited

U.S. PATENT DOCUMENTS

| 4,675,789 | * | 6/1987 | Kuwabar et al. | 361/414 |
| 4,859,806 | * | 8/1989 | Smith | 174/68.5 |
| 4,899,439 | * | 2/1990 | Potter et al. | 29/846 |
| 5,397,861 | * | 3/1995 | Urquhart, II | 174/250 |
| 5,519,176 | * | 5/1996 | Goodman et al. | 174/255 |
| 5,633,479 | * | 5/1997 | Hirano | 174/255 |
| 5,912,809 | * | 6/1999 | Steigerwald et al. | 361/780 |

FOREIGN PATENT DOCUMENTS 9018156   1/1997  (JP).

OTHER PUBLICATIONS

R.A. Jarvela et al., "Wirability Enhancement", IBM Technical Disclosure Bulletin, vol. 21, No. 9, Feb. 1979, p. 3624 (lower right hand corner).*

Low, et al. "Modeling and Experimental Verification of the Interconnected Mesh Power System (IMPS) MCM Topology," IEEE Transactions on Components, Packaging, and Manufacturing Technology—Part B, vol. 20, No. 1, Feb. 1997, pp. 42–49.

* cited by examiner

Primary Examiner—Jeffrey Gaffin
Assistant Examiner—Jeremy Norris
(74) Attorney, Agent, or Firm—Hogan & Hartson, LLP

(57) ABSTRACT

A multi-layer circuit substrate is designed to ensure uniform impedance characteristics for signal conductors even when such conductors are installed at a high density. The device consists of a plurality of planar insulating layers laminated together. In one embodiment a first insulating layer bears a first ground plane formed as an orthogonal grid. A second insulating layer, laminated to the first layer, bears a first set of signal wiring, the traces of which are disposed parallel to one of the orthogonal axes of the ground plane. A third insulating layer, laminated to the second layer, bears either a second ground plane formed as an orthogonal grid or a power plane formed as an orthogonal grid. A fourth insulating layer, laminated to the third layer, bears a second set of signal wiring, the traces of which are disposed parallel to the other orthogonal axis of the first ground plane. The first and second sets of signal wiring are in electrical communication by means of conductors normal to the surface of the device. A fifth insulating layer, laminated to the fourth layer, bears either a second or third ground plane formed as an orthogonal grid. Line widths of the various conductors are selected to optimize the electrical characteristics of the device.

7 Claims, 3 Drawing Sheets

MULTI-LAYER CIRCUIT SUBSTRATE HAVING ORTHOGONAL GRID GROUND AND POWER PLANES

BACKGROUND OF THE INVENTION

1. Field of the Invention

The present invention relates to a multi-layer circuit substrate which is used for an electronic circuit board and so on, and specifically relates to a structure of a conductive layer for an electric wiring conductor in the multi-layer circuit substrate.

2. Description of the Related Art

Conventionally, in a multi-layer circuit substrate which is used for an electronic circuit board and so on with a semiconductor device such as a semiconductor integrated circuit device being mounted, at the time of forming a conductive layer for an electric wiring conductor, an insulating layer made of ceramics such as alumina and a conductive layer for an electric wiring conductor made of a metal with high melting point such as tungsten are alternately laminated. Thus, the multi-layer circuit substrate is constructed.

In the conventional multi-layer circuit substrate, among the conductive layers for electric wiring conductors, a signal wiring conductor has a strip line structure in general, and so-called solid plane ground layers are formed above and below a line conductor layer formed as the signal wiring conductor, via insulating layers.

Further, in order to stabilize power distribution to a semiconductor device mounted on the multi-layer circuit substrate, the contact-patterned ground layer formed in the multi-layer circuit substrate and a conductive layer serving as a power wiring conductor are alternately laminated, whereby a capacity is generated between the ground layer and the conductive layer for a power wiring conductor.

Still further, as electric signals processed by a multi-layer circuit substrate have become faster: an insulating layer is made of a polyimide resin or an epoxy resin, either of which has a comparatively small dielectric constant of between 3.5 and 5, instead of alumina ceramics whose dielectric constant is about 10; on this insulating layer, a conductive layer for an electric wiring conductor made of copper (Cu) is formed using a thin-film forming technique by a vapor phase deposition method such as evaporation and sputtering; a minute wiring pattern is formed by a photolithography method; and the insulating layer and the conductive layer are multi-layered, whereby a multi-layer circuit substrate which shows high-density and high-performance and enables a semiconductor device to operate at a high speed, is obtained.

Furthermore, in such a multi-layer circuit substrate in which the insulating layer is made of a polyimide resin or an epoxy resin, there is a problem that, in the step of curing the resin in the multi-layering process, due to the outgassing of an unreacted component which exists in the resin of a lower layer and moisture which is absorbed by the resin, a solid plane formed on the resin blisters because a path through which the unreacted component and the moisture are dissipated into the air is shut down at the solid plane. Therefore, a ground layer is formed in the shape of a mesh (grid). In this case, it is difficult to generate a capacity by laminating the solid plane ground conductor layer and the conductive layer for a power wiring conductor which are formed in the multi-layer circuit substrate using the conventional ceramics insulating layer, so that a chip capacitor is mounted on the multi-layer circuit substrate so as to stabilize the power distribution to a semiconductor device.

However, in a case where the conventional insulating layer made of a polyimide resin or an epoxy resin is used for multi-layering, since the ground layer is formed in the shape of a mesh, a conductive layer for a signal wiring conductor which is interposed by the ground layers from above and below via the insulating layers, is installed so as to face both a portion where a metal layer forming the mesh ground layer is formed and a portion where the metal layer is unformed. As a result, the characteristic impedance of the signal wiring conductor varies depending on the positional relationship between the signal wiring conductor and the ground layer.

For this reason, the conventional multi-layer circuit substrate has such a problem that, while it is pursued to speed up electric signals as a semiconductor device becomes faster increasingly, high-speed electric signals which pass through a signal wiring conductor are to propagate through a signal wiring conductor having different characteristic impedance, so that a part of the electric signals is reflected, the inputted electric signals are not transmitted to an output side in a correct manner, and malfunctions of an electronic circuit and a semiconductor device occur.

Further, in the power distribution to a semiconductor mounted on the multi-layer circuit substrate, there is also such a problem that, owing to the inductance of a wiring conductor between a chip capacitor for stabilizing the power distribution and the semiconductor device and owing to the length of a distribution line, electric power which is necessary for the power distribution to the semiconductor device cannot be transmitted at a high speed.

In order to resolve the above-mentioned defects of the conventional multi-layer circuit substrate, for example, Japanese Unexamined Patent Publication JP-A 9-18156 (1997) and "Modeling and Experimental Verification of the Interconnected Mesh Power System (IMPS) MCM Topology" IEEE TRANSACTION ON COMPONENTS, PACKAGING, AND MANUFACTURING TECHNOLOGY—PART B. VOL. 20, NO. 1, FEBRUARY 1997, 42–49pp., which is a research released by Arkansas University in USA, disclose that a power wiring conductor, a ground wiring conductor and a signal wiring conductor are formed in the same layer in a multi-layer printed wiring substrate, the signal wiring conductor is placed at a position interposed by the power wiring conductor and the ground wiring conductor so as to form a coplanar line structure, and further this coplanar line is multi-layered at a twisted position, whereby a multi-layer circuit substrate is formed, and the nonuniformity of the characteristic impedance of the signal wiring conductor, which is a problem of the mesh ground structure, is resolved.

However, in a case where a number of signal wiring conductors are led out of a semiconductor device, a power wiring conductor, a ground wiring conductor and a signal wiring conductor are placed in the same layer for each layer in the multi-layer circuit substrate having the coplanar line structure. Therefore, as compared with the multi-layer circuit substrate based on the strip line structure in which only signal wiring conductors are placed in the same layer, the multi-layer circuit substrate having the coplanar line structure can obtain only about one-third of wiring density and hence cannot meet the requirement to densify wiring conductors.

Especially in recent years, as a semiconductor device has become high-performance, the number of signal wiring conductors of the semiconductor device needs to be more than 100, so that it has become further difficult to efficiently connect a number of signal wiring conductors to a semiconductor device in the multi-layer circuit substrate having the coplanar line structure.

SUMMARY OF THE INVENTION

The present invention was made in view of the above-mentioned problems, and an object of the invention is to provide a multi-layer circuit substrate which, by uniformizing the characteristic impedance of a signal wiring conductor, can prevent an occurrence of a noise due to a reflection caused by nonuniformity of the characteristic impedance when high-speed signals are propagated and prevent a malfunction of a semiconductor device, and further which can efficiently connect a number of signal wiring conductors to a semiconductor device.

A multi-layer circuit substrate according to a first aspect of the invention comprises:

first to fifth insulating layers laminated sequentially, the first insulating layer having an upper face on which a first ground wiring conductor is installed in the shape of a grid;

the second insulating layer having an upper face on which a first signal wiring conductor is installed so as to overlie a wiring conductor in one of grid line directions of the first ground wiring conductor;

the third insulating layer having an upper face on which a second ground wiring conductor is installed so as to overlie the first ground wiring conductor, the second ground wiring conductor having almost the same grid shape as that of the first ground wiring conductor;

the fourth insulating layer having an upper face on which a second signal wiring conductor is installed so as to overlie a wiring conductor in the other grid line direction of the first ground wiring conductor;

the fifth insulating layer having an upper face on which a third ground wiring conductor is installed so as to overlie the first ground wiring conductor, the third ground wiring conductor having almost the same grid shape as that of the first ground wiring conductor, wherein a line width of the first signal wiring conductor is equal to or narrower than line widths of the first and second ground wiring conductors, and a line width of the second signal wiring conductor is equal to or narrower than line widths of the second and third ground wiring conductors, and wherein the first signal wiring conductor and the second signal wiring conductor are connected to each other via a through conductor which passes through the third and fourth insulating layers and the second ground wiring conductor so as to be insulated from the second ground wiring conductor.

According to the invention: the first to third ground wiring conductors are installed in the shapes of almost the same shapes of grids which overlie each other; the first signal wiring conductor is installed between the first ground wiring conductor and the second ground wiring conductor so as to overlie the wiring conductor of one of the grid line directions of the first ground wiring conductor; the second signal wiring conductor is installed between the second ground wiring conductor and the third ground wiring conductor so as to overlie the wiring conductor in the other grid line direction of the first ground wiring conductor; and the line width of each signal wiring conductor is equal to or narrower than the line widths of the ground wiring conductors which are installed above and below the signal wiring conductors. Therefore, in the whole region of each signal wiring conductor, a strip line structure is configured between the signal wiring conductors and the ground wiring conductors installed above and below the signal wiring conductors, so that uniformization of the characteristic impedance can be realized, and signals which are inputted and outputted to a semiconductor device connected to the signal wiring conductors can be transmitted in a stable manner.

Further, a strip line structure is configured by the signal wiring conductors and the grid ground wiring conductors placed above and below the signal wiring conductors, thereby uniformizing the characteristic impedance, with the result that it is possible to meet the densification of signal wiring conductors.

Furthermore, the first signal wiring conductor installed in one of the grid line directions and the second signal wiring conductor installed in the other grid line direction, are electrically connected to each other via the through conductor which passes through the third and fourth insulating layers and the second ground wiring conductor so as to be electrically insulated from the second ground wiring conductor. Therefore, a capacity is generated between the middle part of the through conductor and the second ground wiring conductor, so that it is possible to suppress an increase of the characteristic impedance at the through conductor due to an inductance component of the through conductor, and to obtain a uniform characteristic impedance in the whole signal wiring conductors including the through conductor.

Further, a multi-layer circuit substrate according to a second aspect of the invention comprises:

first to fourth insulating layer laminated sequentially, the first insulating layer having an upper face on which a first ground wiring conductor is installed in the shape of a grid;

the second insulating layer having an upper face on which a first signal wiring conductor is installed so as to overlie a wiring conductor in one of grid line directions of the first ground wiring conductor;

the third insulating layer having an upper face on which a second signal wiring conductor is installed so as to overlie a wiring conductor in the other grid line direction of the first ground wiring conductor;

the fourth insulating layer having an upper face on which a second ground wiring conductor is installed so as to overlie the first ground wiring conductor, the second ground wiring conductor having almost the same grid shape as that of the first ground wiring conductor, wherein line widths of the first and second signal wiring conductors are equal to or narrower than line widths of the first and second ground wiring conductors, and wherein the first signal wiring conductor and the second signal wiring conductor are connected to each other via a through conductor which passes through the third insulating layer.

Further, according to the invention: the first and second ground wiring conductors are installed in the shapes of almost the same shapes of grids which overlie each other, between which the first signal wiring conductor is installed so as to overlie the wiring conductor of one of the grid line directions of the first ground wiring conductor and the second signal wiring conductor is installed so as to overlie the wiring conductor in the other grid line direction of the first ground wiring conductor; and the line width of each signal wiring conductor is equal to or narrower than the widths of the ground wiring conductors installed above and below the signal wiring conductors. Therefore, in the whole region of each signal wiring conductor, a strip line structure is configured between the signal wiring conductors and the ground wiring conductors installed above and below the signal wiring conductors, so that uniformization of the characteristic impedance can be realized, and signals which are inputted and outputted to a semiconductor device connect ed to the signal wiring conductors can be transmitted in a stable manner.

In addition, as well as the multi-layer circuit substrate of the first aspect of the invention, the second multi-layer circuit substrate can meet the densification of the signal wiring conductors, and moreover, the first signal wiring conductor installed in one of the grid line directions and the second signal wiring conductor installed in the other grid line direction are electrically connected to each other via the through conductor which passes through the third insulating layer. Therefore, the length of the through conductor is minimized, and an increase of the characteristic impedance due to the inductance component of the through conductor can be reduced to an ignorable extent.

Still further, a multi-layer circuit substrate according to a third aspect of the invention comprises:

first to fifth insulating layers laminated sequentially, the first insulating layer having an upper face on which a first ground wiring conductor is installed in the shape of a grid;

the second insulating layer having an upper face on which a first signal wiring conductor is installed so as to overlie a wiring conductor in one of grid line directions of the first ground wiring conductor;

the third insulating layer having an upper face on which a power wiring conductor is installed so as to overlie the first ground wiring conductor, the power wiring conductor having almost the same grid shape as that of the first ground wiring conductor;

the fourth insulating layer having an upper face on which a second signal wiring conductor is installed so as to overlie a wiring conductor in the other grid line direction of the first ground wiring conductor;

the fifth insulating layer having an upper face on which a second ground wiring conductor is installed so as to overlie the first ground wiring conductor, the second ground wiring conductor having almost the same grid shape as that of the first ground wiring conductor, wherein a line width of the first signal wiring conductor is equal to or narrower than line widths of the first ground wiring conductor and the power wiring conductor, and a line width of the second signal wiring conductor is equal to or narrower than line widths of the power wiring conductor and the second ground wiring conductor, and wherein the first signal wiring conductor and the second signal wiring conductor are connected to each other via a through conductor which passes through the third and fourth insulating layers and the power wiring conductor so as to be insulated from the power wiring conductor.

Still further, according to the invention: the first and second ground wiring conductors and the power wiring conductor are installed in almost the same shapes of grids which overlie each other; the first signal wiring conductor is installed between the first ground wiring conductor and the power wiring conductor so as to overlie the wiring conductor of one of the grid line directions of the first ground wiring conductor; the second signal wiring conductor is installed between the power wiring conductor and the second ground wiring conductor so as to overlie the wiring conductor in the other grid line direction of the first ground wiring conductor; and the line width of each signal wiring conductor is equal to or narrower than the line widths of the ground wiring conductors installed above and below the signal wiring conductors and the power wiring conductor. Therefore, the respective signal wiring conductors have an electrically identical positional relations with respect to the ground wiring conductors, and, in the whole region of each signal wiring conductor, a strip line structure is configured between the signal wiring conductors and the ground wiring conductors installed above and below the signal wiring conductors, so that uniformization of the characteristic impedance can be realized, and signals which are inputted and outputted to a semiconductor device connected to the signal wiring conductors can be transmitted in a stable manner.

In addition, as well as the multi-layer circuit substrate of the first aspect of the invention, the third multi-layer circuit substrate can meet the densification of the signal wiring conductors, and moreover, the first signal wiring conductor installed in one of the grid line directions and the second signal wiring conductor installed in the other grid line direction are electrically connected to each other via the through conductor which passes through the third and fourth insulating layers and the power wiring conductor so as to be electrically insulated from the power wiring conductor. Therefore, a capacity is generated between the middle part of the through conductor and the power wiring conductor, so that it is possible to suppress an increase of the characteristic impedance at the through conductor due to the inductance component of the through conductor, and to obtain a uniform characteristic impedance in the whole signal wiring conductors including the through conductor.

Furthermore, a multi-layer circuit substrate according to a fourth aspect of the invention is characterized in that aperture area ratios of respective grids of the first to third ground wiring conductors and the power wiring conductor which are installed in shapes of grids, are in a range of 5% to 80% in the any of the multi-layer circuit substrates according to the first to third aspects of the invention.

According to the invention, when the aperture area ratio of each grid of the first to third ground wiring conductors and the power wiring conductors which are installed in the shapes of grids in the first to third multi-layer circuit substrates, is set to be in a range of 5% to 80%, delamination and so on will not occur between the insulating layer and the grid wiring conductor, or between the insulating layers interposing the grid wiring conductor, and a strip line structure in which a sufficiently stabilized ground state is ensured with respect to the signal wiring conductors formed between the grid wiring conductors, can be realized, so that more preferable signals can be transmitted in a stable manner and a higher reliability as a wiring board can be obtained.

Furthermore, a multi-layer circuit substrate according to a fifth aspects of the invention is characterized in that, in any of the multi-layer circuit substrates according to the first to third aspect of the invention, the first insulating layer is formed of a ceramic material, and the other insulating layers are formed of a resin material.

According to the invention, the first insulating layer is formed of a ceramic material so as to serve also as a supporting substrate, and the second to fifth insulating layers laminated on the first insulating layer are formed of a resin material such as a polyimide resin. Therefore, an electronic circuit is formed on the substrate which is stable in terms of a mechanical intensity, and deformations of circuit wirings due to deformations in substrate or the like are avoided, with the result that a substrate having an excellent high-frequency characteristic is achieved. Furthermore, when the first insulating layer is configured to be a ceramic substrate, moisture will not enter via the ceramic substrate, so that the moisture adsorbed by resin layers formed on the ceramic substrate is reduced and thus change in dielectric constant is suppressed. Therefore, a multi-layer circuit substrate having an excellent high-frequency characteristic is obtained.

Further, a multi-layer circuit substrate according to a sixth aspect of the invention is characterized in that, in the multi-layer circuit substrate of the fifth aspect of the invention, each of the first and the second signal wiring conductors is composed of an adhesive metal layer formed of a metal selected from the group consisting of chromium, titanium, molybdenum and niobium, and a main conductor metal layer formed of a metal selected from the group consisting of copper, silver and gold.

According to the invention, when the insulating layers are formed of a polyimide resin or the like, a main conductor metal layer formed of a metal selected from the group consisting of copper, silver and gold, as well as an adhesive metal layer formed of a metal selected from the group consisting of chromium, titanium, molybdenum and niobium are used as a signal wiring conductor. By employing this constitution, adhesion between the insulating layer and the main conductor metal layer is improved, and an excellent transmission characteristic of high-frequency signals is realized.

In this case, when the ground wiring conductor is also composed of an adhesive metal layer and a main conductor metal layer, adhesion between the insulating layer and the ground layer is improved, allowing more excellent transmission characteristic of high-frequency signals. When the insulating layers are formed of a ceramic material, metals for use in the adhesive metal layer are as follows: metals of $4a$, $5a$ and $6a$ groups in the periodic table, specifically, titanium, niobium, chromium, molybdenum and tungsten.

Further, a multi-layer circuit substrate according to a seventh aspect of the invention is characterized in that, in the multi-layer circuit substrate of the sixth aspect of the invention, a thickness of the adhesive metal layer is in a range of 0.03 $\mu$m to 0.2 $\mu$m and a thickness of the main conductor metal layer is in a range of 1 $\mu$m to 10 $\mu$m.

In the case where the thickness of the adhesive metal layer is less than 0.03 $\mu$m, an effect to enhance the adhesion of the metal conductor layer is not sufficiently high. On the contrary, in the case of more than 0.2 $\mu$m, when a signal of 10 GHz, for example, is transmitted, the thickness of a metal involved in the signal transmission is approximately 0.6 $\mu$m, one-third or more of which is dominated by the adhesive metal layer, with the result that the main conductor metal layer having a low resistance cannot perform in a sufficiently good manner.

Further, in the case where the thickness of the main conductor metal layer is less than 1$\mu$m, the resistance of the wiring conductor is increased, so that it is likely to be difficult to ensure good power distribution to a semiconductor device and a stable ground, and to propagate signals in a good state. On the contrary, in the case of more than 10$\mu$m, the insulating layer, which is laminated on this main conductor metal layer, cannot cover sufficiently, so that an insulation failure may occur.

As described above, according to the invention, it is possible to provide a multi-layer circuit substrate which, by uniformizing the characteristic impedance of signal wiring conductors, can prevent an occurrence of a noise due to a reflection caused by nonuniformity of the characteristic impedance when high-speed signals are propagated and prevent a malfunction of a semiconductor device, and further which can efficiently connect a number of signal wiring conductors to a semiconductor device.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
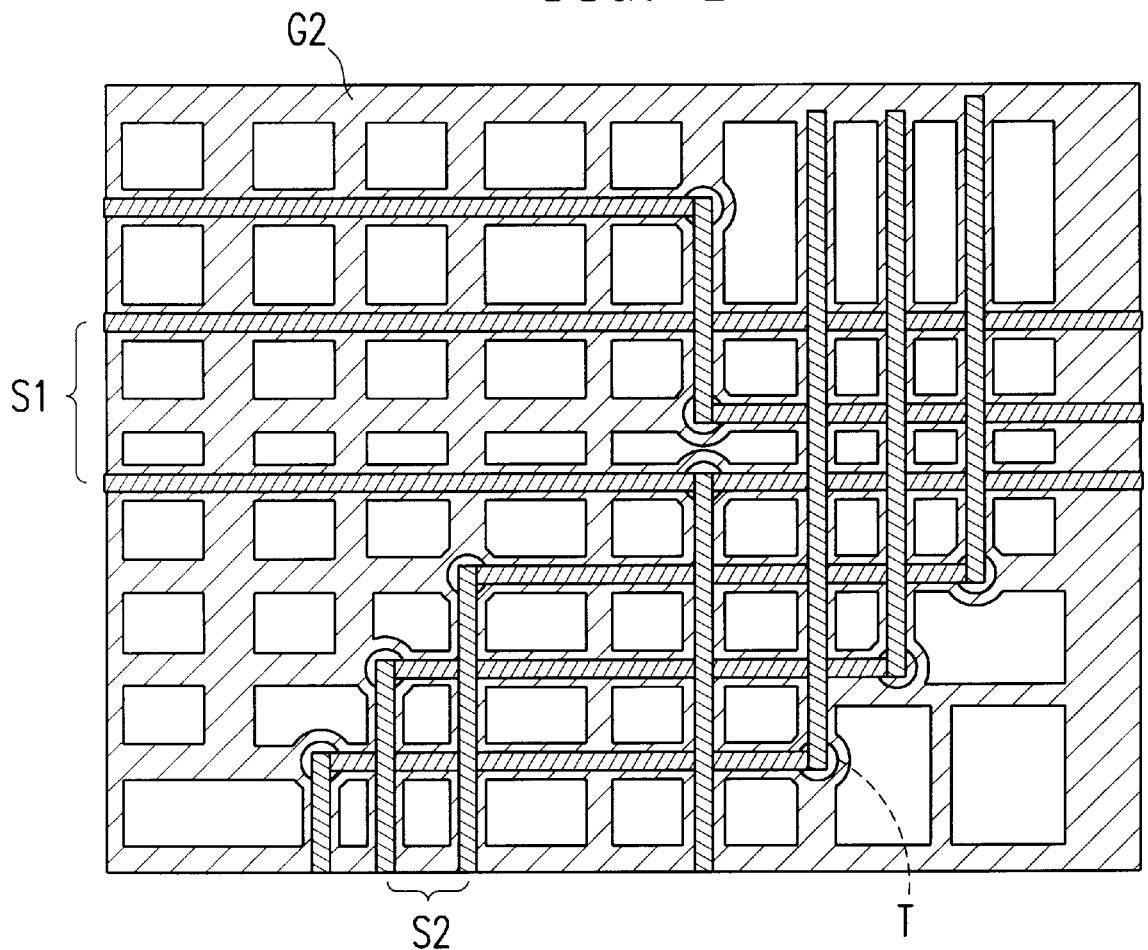
FIG. 1 is a plan view showing an embodiment of a multi-layer circuit substrate according to a first aspect of the invention.

Now referring to the drawings, preferred embodiments of the invention are described below.

Figure 2:
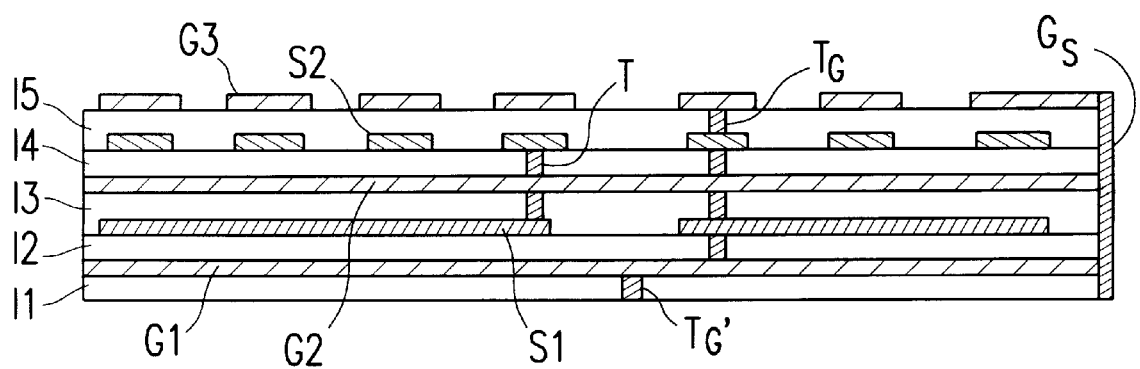
FIG. 2 is a sectional view showing the embodiment of the multi-layer circuit substrate according to the first aspect of the invention.

FIGS. 1 and 2 are a plan view and a sectional view which show an embodiment of a multi-layer circuit substrate according to a first aspect of the invention. In order to facilitate the understanding of the positional relations of laminated ground wiring conductors and signal wiring conductors, a perspective plan view of first and second signal wiring conductors and a second ground wiring conductor, and a sectional view (not a single section) which presents the connecting states of the respective wiring conductors, are shown.

As shown in FIG. 2, second to fifth insulating layers I2 to I5 are sequentially laminated on a first insulating layer I1. On the upper face of the first insulating layer I1, a first ground wiring conductor G1 is installed in a form of a grid. On the upper face of the third insulating layer I3, a second ground wiring conductor G2 is installed in a form of a grid having almost the same shape with the first ground wiring conductor G1. On the upper face of the fifth insulating layer I5, a third ground wiring conductor G3 is installed in a form of a grid having almost the same shape with the first ground wiring conductor G1. On the fifth insulating layer I5 on which the third ground wiring conductor G3 is installed, an insulating layer may be further laminated.

Further, it is desirable that the first to third ground wiring conductors G1 to G3 are electrically connected to each other in order to be in the same ground state. For such a connection, later-described through conductors $T_G$ and $T_G{'}$ which are insulated from first and second signal wiring conductors S1 and S2, may be used, and a connecting conductor layer $G_S$ which is formed on the side faces of the respective insulating layers I1 to I5 may be used.

The grid shape that the first to third ground wiring conductors G1 to G3 are installed, may be an orthogonal grid in which grid lines intersect with each other at right angles, or a diagonal grid in which grid lines intersect with each other diagonally. Further, the intervals of the respective grid lines may be uniform, or may be arbitrarily differentiated. These are selected and set as necessary depending on the specification of a multilayer wiring board.

A first signal wiring conductor S1 is installed on the upper face of the second insulating layer I2 so as to overlie a wiring conductor of one of the grid line directions of the first ground wiring conductor G1, for example, a so-called x-direction in the case of an orthogonal grid, or one of the diagonally intersecting grid line directions in the case of a diagonal grid, or the lateral direction of FIG. 1 in this embodiment, via the second insulating layer I2. A second signal wiring conductor S2 is installed on the upper face of the fourth insulating layer I4 so as to overlie a wiring conductor in the other grid line direction of the first ground wiring conductor G1, for example, a so-called y-direction in the case of an orthogonal grid, or the other diagonally intersecting grid line direction in the case of a diagonal grid, or in the vertical direction of FIG. 1 in this embodiment, via the second insulating layer I2 to the fourth insulating layer I4. Installed in such a manner, the first signal wiring conductor S1 also overlie a wiring conductor of one of the grid line directions of the second ground wiring conductor G2 via the third insulating layer I3, and the second signal wiring conductor S2 also overlie a wiring conductor in the other grid line direction of the second ground wiring conductor G2 via the fourth insulating layer I4 and a wiring conductor in the other grid line direction of the third ground wiring conductor G3 via the fifth insulating layer I5.

Further, the line width of the first signal wiring conductor S1 is equal to or narrower than the line widths of the first ground wiring conductor G1 and the second ground wiring conductor G2, and the line width of the second signal wiring conductor S2 is equal to or narrower than the line widths of the second ground wiring conductor G2 and the third ground wiring conductor G3.

The first signal wiring conductor S1 and the second signal wiring conductor S2 are installed selectively at a place where they are needed according to the specification of a multi-layer circuit substrate in the respective grid line directions.

By such a configuration, the first signal wiring conductor S1 forms a strip line structure between the first ground wiring conductor G1 and the second ground wiring conductor G2, and the second signal wiring conductor S2 forms a strip line structure between the second ground wiring conductor G2 and the third ground wiring conductor G3.

The first signal wiring conductor S1 and the second signal wiring conductor S2 are electrically connected to each via a through conductor T. The through conductor T is formed as a through hole conductor or a via hole conductor, which passes through the third insulating layer I3, the fourth insulating layer I4 and the second ground wiring conductor G2 so as to be electrically insulated from the second ground wiring conductor G2. This through conductor T is installed as necessary in accordance with the specification of a multi-layer circuit substrate, so as to connect the signal wiring conductors S1 and S2 when the same electric signals are transmitted through both the first signal wiring conductor S1 and the second signal wiring conductor S2.

Further, since the through conductor T is to connect at the shortest distance the first signal wiring conductor S1 and the second signal wiring conductor S2 which are installed in different layers in different grid line directions, the through conductor T is formed so as to pass through a wiring conductor at a grid point of the second ground wiring conductor G2 installed in a form of a grid, and is passed through a hole having an area larger than the section area of the through conductor T, which is opened on the wiring conductor at the grid point, thereby electrically insulated from the wiring conductor of the second ground wiring conductor G2 with a necessary space being ensured.

According to the multi-layer circuit substrate of the first aspect of the invention: the first to third ground wiring conductors G1 to G3 are installed in the shapes of almost the same shapes of grids which overlie each other; the first signal wiring conductor S1 is installed between the first ground wiring conductor G1 and the second ground wiring conductor G2 so as to overlie the wiring conductor of one of the grid line directions of the first ground wiring conductor G1; the second signal wiring conductor S2 is installed between the second ground wiring conductor G2 and the third ground wiring conductor G3 so as to overlie the wiring conductor in the other grid line direction of the first ground wiring conductor G1; and the line widths of the respective signal wiring conductors S1 and S2 are equal to or narrower than the line widths of the ground wiring conductors G1 to G3 installed above and below the signal wiring conductors. Therefore, in the whole region of each of the signal wiring conductors S1 and S2, a so-called strip line structure is configured between the signal wiring conductors and the ground wiring conductors G1 to G3 installed above and below the signal wiring conductors. As a result, it is possible to: realize uniformization of the characteristic impedance so that high-speed signals propagate through the signal wiring conductors S1 and S2 while performing electromagnetic coupling between the signal wiring conductors and the ground wiring conductors G1 to G3 installed above and below the signal wiring conductors; transmit signals which are inputted and outputted to a semiconductor device connected to the signal wiring conductors S1 and S2 in a stable manner; and prevent a malfunction of the semiconductor device.

Further, a strip line structure is thus configured by the signal wiring conductors S1 and S2 and the grid ground wiring conductors G1 to G3 placed above and below the signal wiring conductors, thereby uniformizing the characteristic impedance, with the result that the wiring density of the signal wiring conductors will not decrease as observed in the conventional wiring board using a coplanar line structure, and it is possible to meet the densification of the wiring conductors.

Furthermore, the first signal wiring conductor S1 installed in one of the grid line directions and the second signal wiring conductor S2 installed in the other grid line direction, are electrically connected to each other via the through conductor T which passes through the third and fourth insulating layers I3 and I4 and the second ground wiring conductor G2 so as to be electrically insulated from the second ground wiring conductor G2. Therefore, a capacity is generated between the middle part of the through conductor T and the second ground wiring conductor G2, so that it is possible to suppress an increase of the characteristic impedance at the through conductor T due to the inductance component of the through conductor T, and to obtain a uniform characteristic impedance in the whole signal wiring conductors including the through conductor T.

Figure 3:
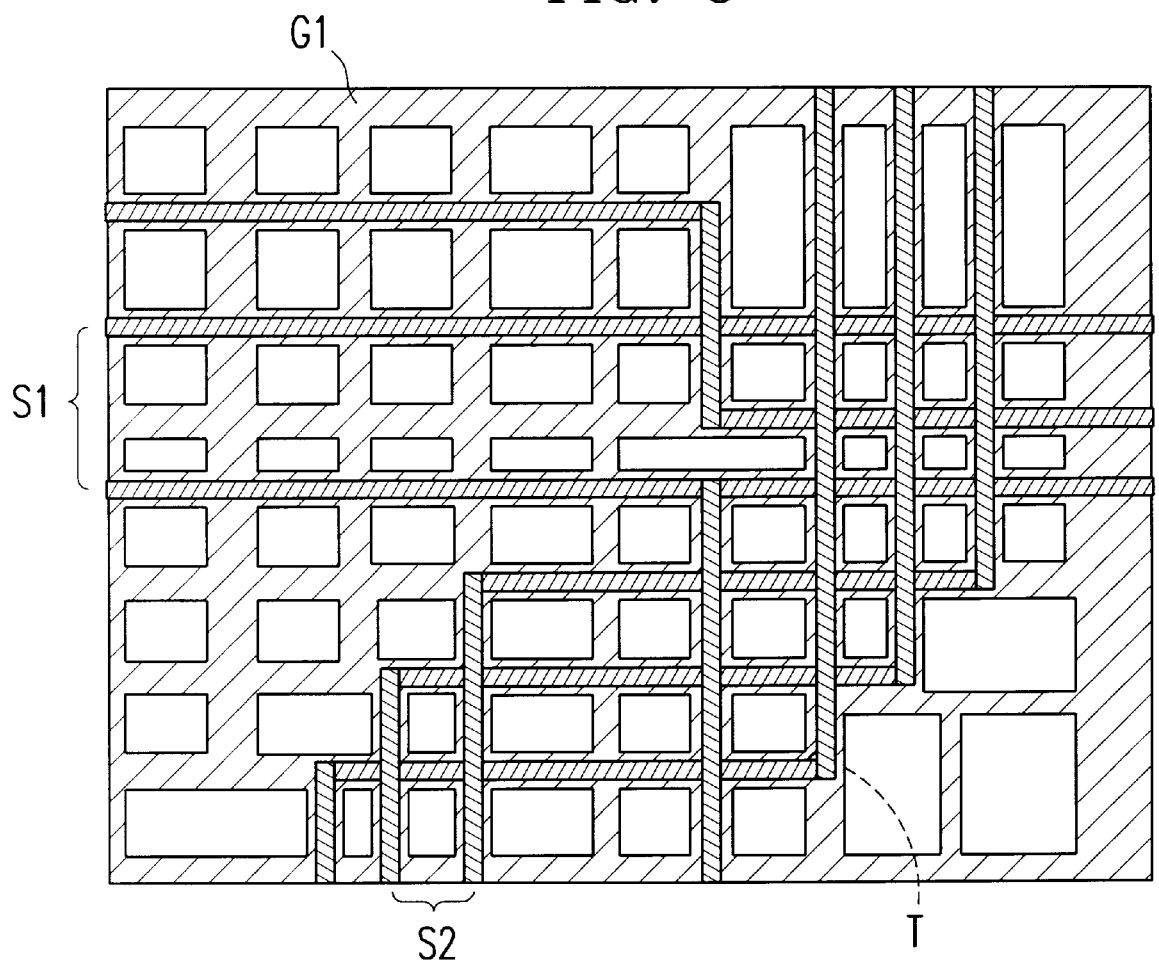
FIG. 3 is a plan view showing an embodiment of a multi-layer circuit substrate according to a second aspect of the invention.
Figure 4:
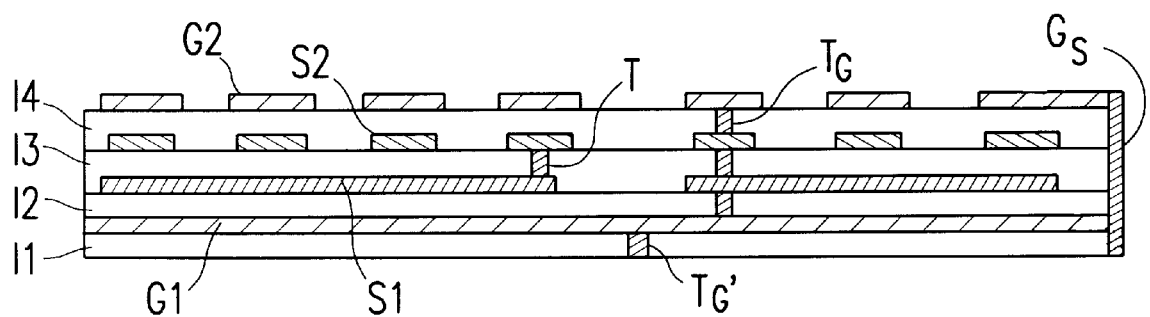
FIG. 4 is a sectional view showing the embodiment of the multi-layer circuit substrate according to the second aspect of the invention.

Next, FIGS. 3 and 4 are a plan view and a sectional view similar to FIGS. 1 and 2, showing an embodiment of a multi-layer circuit substrate according to a second aspect of the invention.

As shown in FIG. 4, second to fourth insulating layers I2 to I4 are sequentially laminated on a first insulating layer I1. On the upper face of the first insulating layer I1, a first ground wiring conductor G1 is installed in the shape of a grid. On the upper face of the fourth insulating layer I4, a second ground wiring conductor G2 is installed in the shape of a grid having almost the same shape with the first ground wiring conductor G1. On the fourth insulating layer I4 on which the second ground wiring conductor G2 is installed, an insulating layer may be further laminated.

Further, it is desirable that the first and second ground wiring conductors G1 and G2 are electrically connected to each other in order to be in the same ground state. Also for such a connection, through conductors $T_G$ and $T_G'$ may be used, and a connecting conductor layer $G_S$ which is formed on the side faces of the respective insulating layers I1 to I4 may be used.

The grid shape of the first and second ground wiring conductors G1 and G2 may also be an orthogonal grid or a diagonal grid, and the intervals of the respective grid lines may be uniform or may be arbitrarily differentiated.

A first signal wiring conductor S1 is installed on the upper face of the second insulating layer I2 so as to overlie a wiring conductor of one of the grid line directions of the first ground wiring conductor G1 (the lateral direction in FIG. 3) via the second insulating layer I2, and a second signal wiring conductor S2 is installed on the upper face of the third insulating layer I3 so as to overlie a wiring conductor in the other grid line direction of the first ground wiring conductor G1 (the vertical direction in FIG. 3) via the second insulating layer I2 and the third insulating layer I3. Installed in such a manner, the first signal wiring conductor S1 also overlie a wiring conductor of one of the grid line directions of the second ground wiring conductor G2 via the third and fourth insulating layers I3 and I4, and the second signal wiring conductor S2 also overlie a wiring conductor in the other grid line direction of the second ground wiring conductor G2 via the fourth insulating layer I4. Both the first and second signal wiring conductors S1 and S2 are installed between the first ground wiring conductor G1 and the second ground conductor G2.

Further, both of the line widths of the first and second signal wiring conductors S1 and S2 are equal to or narrower than the line widths of the first ground wiring conductor G1 and the second ground wiring conductor G2.

Both the first signal wiring conductor S1 and the second signal wiring conductor S2 are installed selectively at a place where they are needed according to the specification of a multi-layer circuit substrate in the respective grid line directions.

By such a configuration, the first and second signal wiring conductors S1 and S2 form strip line structures between the first ground wiring conductor G1 and the second ground wiring conductor G2, respectively.

The first signal wiring conductor S1 and the second signal wiring conductor S2 are electrically connected to each other via a through conductor T. The through conductor T is formed as a through hole conductor or a via hole conductor, which passes through the third insulating layer I3. This through conductor T is also installed as necessary in accordance with the specification of a multi-layer circuit substrate, so as to connect the signal wiring conductors S1 and S2 when the same electric signals are transmitted through both the first signal wiring conductor S1 and the second signal wiring conductor S2.

Further, since the through conductor T is to connect at the shortest distance the first signal wiring conductor S1 and the second signal wiring conductor S2 which are installed in different layers in different grid line directions, the through conductor T is formed at a position which corresponds to a grid point of the first ground wiring conductor G1 installed in the shape of a grid.

According to the multi-layer circuit substrate of the second aspect of the invention: the first and second ground wiring conductors G1 and G2 are installed in the shapes of almost the same shapes of grids which overlie each other, between which the first signal wiring conductor S1 is installed so as to overlie the wiring conductor of one of the grid line directions of the first ground wiring conductor G1 and the second signal wiring conductor S2 is installed so as to overlie the wiring conductor in the other grid line direction of the first ground wiring conductor G1; and the line widths of the respective signal wiring conductors S1 and S2 are equal to or narrower than the widths of the ground wiring conductors G1 and G2 installed above and below the signal wiring conductors. Therefore, in the whole region of each of the signal wiring conductors S1 and S2, a strip line structure is configured between the signal wiring conductors and the ground wiring conductors G1 and G2 installed above and below the signal wiring conductors. As a result, it is possible to: realize uniformization of the characteristic impedance so that high-speed signals propagate through the signal wiring conductors S1 and S2 while performing electromagnetic coupling between the signal wiring conductors and the ground wiring conductors G1 to G3 installed above and below the signal wiring conductors; transmit signals which are inputted and outputted to a semiconductor device connected to the signal wiring conductors S1 and S2 in a stable manner; and prevent a malfunction of the semiconductor device.

Further, as well as in the case of the multi-layer circuit substrate of first embodiment, the wiring density of the signal wiring conductors will not decrease as observed in the conventional wiring board using a coplanar line structure, and it is possible to meet the densification of wiring conductors.

Furthermore, the first signal wiring conductor S1 installed in one of the grid line directions and the second signal wiring conductor S2 installed in the other grid line direction, are electrically connected to each other via the through conductor T which passes through the third insulating layer I3, with the result that the length of the through conductor T is to be minimized, and it becomes possible to reduce an increase of the characteristic impedance due to the inductance component of the through conductor T, to an ignorable extent.

Figure 5:
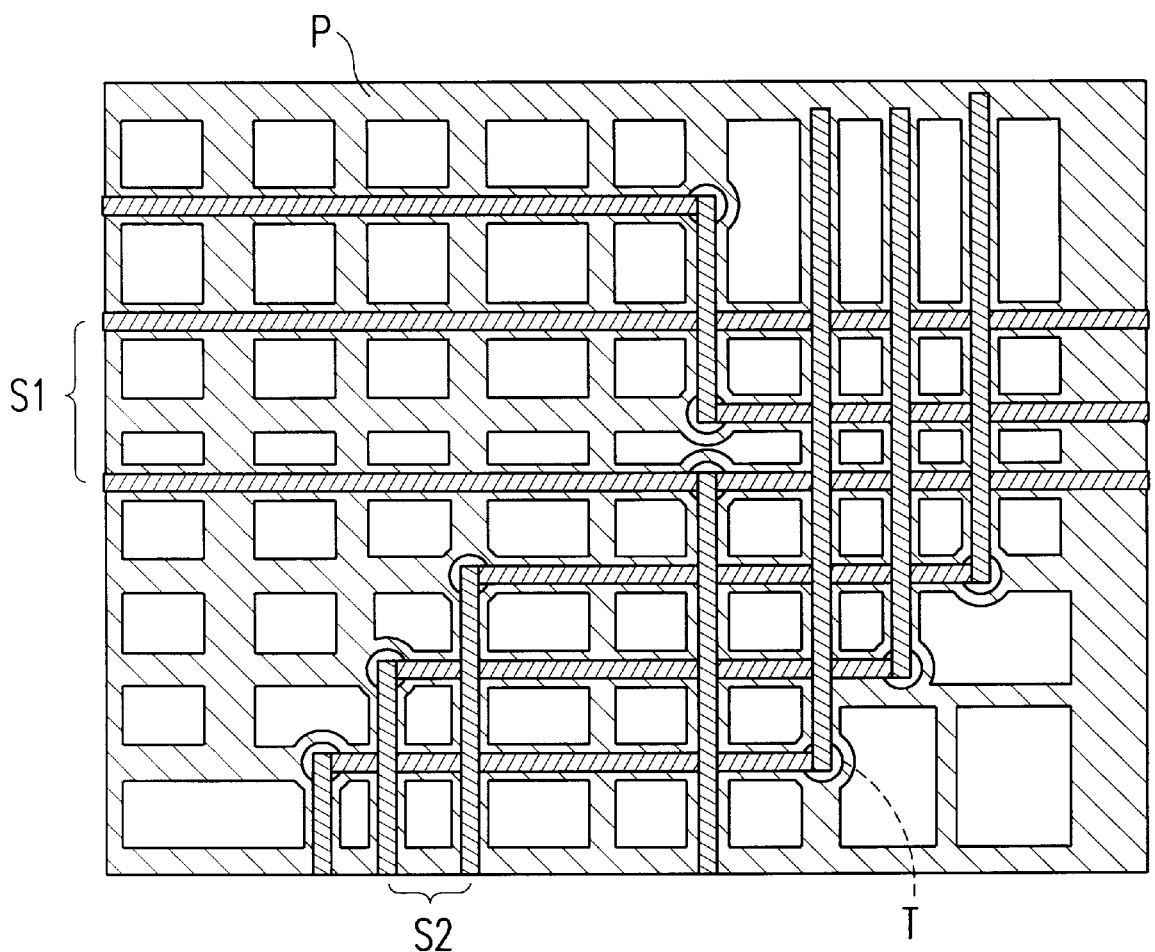
FIG. 5 is a plan view showing an embodiment of a multi-layer circuit substrate according to a third aspect of the invention.
Figure 6:
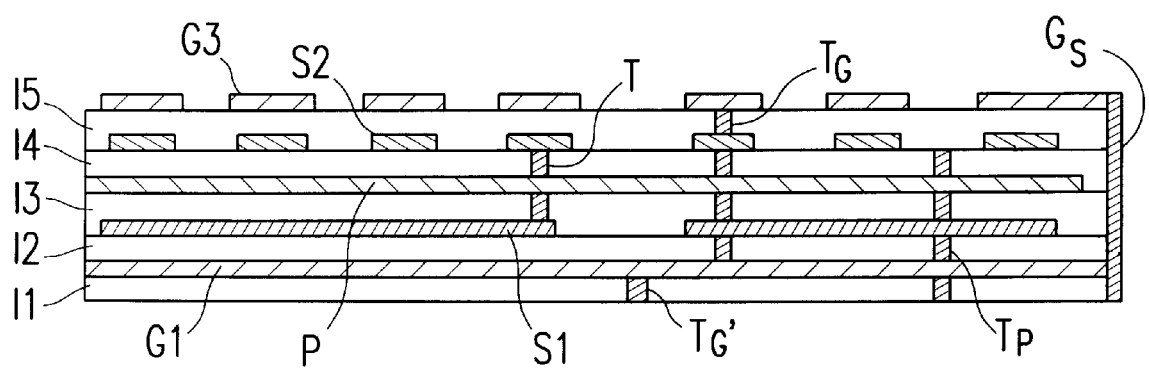
FIG. 6 is a sectional view showing the embodiment of the multi-layer circuit substrate according to the third aspect of the invention.

FIGS. 5 and 6 are a plan view and a sectional view similar to FIGS. 1 and 2, showing an embodiment of a multi-layer circuit substrate according to a third aspect of the invention.

As shown in FIG. 6, second to fifth insulating layers I2 to I5 are sequentially laminated on a first insulating layer I1. On the upper face of the first insulating layer I1, a first ground wiring conductor G1 is installed in the shape of a grid. On the upper face of the fifth insulating layer I5, a second ground wiring conductor G2 is installed in the shape of a grid having almost the same shape with the first ground wiring conductor G1. On the fifth insulating layer I5 on which the second ground wiring conductor G2 is installed, an insulating layer may be further laminated.

Further, it is desirable that the first and second ground wiring conductors G1 and G2 are electrically connected to each other in order to be in the same ground state. Also for such a connection, through conductors $T_G$ and $T_G'$ may be used, and a connecting conductor layer $G_S$ which is formed on the side faces of the respective insulating layers I1 to I5 may be used.

Still further, a power wiring conductor P is installed on the upper face of the third insulating layer I3 in the shape of a grid having almost the same shape with the first ground wiring conductor G1.

In order to perform power distribution from an outer electric circuit to this power wiring conductor P, a through conductor $T_P$ which is insulated from the first ground wiring conductor G1 and from the first signal wiring conductor S1, may be provided, for example.

The grid shapes of the first and second ground wiring conductors G1 and G2 and the power wiring conductor P may also be an orthogonal grid or a diagonal grid, and the intervals of the respective grid lines may be uniform or may be arbitrarily differentiated.

A first signal wiring conductor S1 is installed on the upper face of the second insulating layer I2 so as to overlie a wiring conductor of one of the grid line directions of the first ground wiring conductor G1 (the lateral direction in FIG. 5) via the second insulating layer I2, and a second signal wiring conductor S2 is installed on the upper face of the fourth insulating layer I4 so as to overlie a wiring conductor in the other grid line direction of the first ground wiring conductor G1 (the vertical direction in FIG. 5) via the second to fourth insulating layers I2 to I4. Installed in such amanner, the first signal wiring conductor S1 also overlie a wiring conductor of one of the grid line directions of the power wiring conductor P via the third insulating layer I3, and the second signal wiring conductor S2 also overlie a wiring conductor in the other grid line direction of the power wiring conductor P via the fourth insulating layer I4 and a wiring conductor in the other grid line direction of the second ground wiring conductor G2 via the fifth insulating layer I5.

Further, the line width of the first signal wiring conductor S1 is equal to or narrower than the line widths of the first ground wiring conductor G1 and the power wiring conductor P, and the line width of the second signal wiring conductor S2 is equal to or narrower than the line widths of the power wiring conductor P and the second ground wiring conductor G2.

Both the first signal wiring conductor S1 and the second signal wiring conductor S2 are installed selectively at a place where they are needed according to the specification of a multi-layer circuit substrate in the respective grid line directions.

By such a configuration, the first signal wiring conductor S1 forms a strip line structure between the first ground wiring conductor G1 and the power wiring conductor P, and the second signal wiring conductor S2 forms a strip line structure between the power wiring conductor P and the second ground wiring conductor G2.

The first signal wiring conductor S1 and the second signal wiring conductor S2 are electrically connected to each other via a through conductor T. The through conductor T is formed as a through hole conductor or a via hole conductor, which passes through the third insulating layer I3, the fourth insulating layer I4 and the power wiring conductor P so as to be insulated from the power wiring conductor P. This through conductor T is also installed as necessary in accordance with the specification of a multi-layer circuit substrate, so as to connect the signal wiring conductors S1 and S2 when the same electric signals are transmitted through both the first signal wiring conductor S1 and the second signal wiring conductor S2.

Further, the through conductor T is to connect at the shortest distance the first signal wiring conductor S1 and the second signal wiring conductor S2 which are installed in different layers in different grid line directions, so that the through conductor T is formed so as to pass through a wiring conductor at a grid point of the power wiring conductor P installed in the shape of a grid, and passed through a hole having an area larger than the section area of the through conductor T which is opened on the wiring conductor at the grid point, thereby electrically insulated from the wiring conductor of the power wiring conductor P with a necessary space being ensured.

According to the multi-layer circuit substrate of the third aspect of the invention: the first and second ground wiring conductors G1 and G2 and the power wiring conductor P are installed in almost the same shapes of grids which overlie each other, respectively, the first signal wiring conductor S1 is installed between the first ground wiring conductor G1 and the power wiring conductor P so as to overlie the wiring conductor of one of the grid line directions of the first ground wiring conductor G1, the second signal wiring conductor S2 is installed between the power wiring conductor P and the second ground wiring conductor G2 so as to overlie the wiring conductor in the other grid line direction of the first ground wiring conductor G2, and the line widths of the respective signal wiring conductors S1 and S2 are equal to or narrower than the line widths of the ground wiring conductors G1 and G2 installed above and below the signal wiring conductors and the power wiring conductor P. As a result, while one face of each of the signal wiring conductors S1 and S2 faces the power wiring conductor P, the signal wiring conductors S1 and S2 have a positional relation which is electrically the same with respect to the ground wiring conductors G1 and G2, and, in the whole region of each of the respective signal wiring conductors S1 and S2, a so-called strip line structure is configured between the signal wiring conductors and the ground wiring conductors G1 and G2 installed above and below the signal wiring conductors. Therefore, it is possible to: realize uniformization of the characteristic impedance so that high-speed signals propagate through the signal wiring conductors S1 and S2 while performing electromagnetic coupling between the signal wiring conductors and the ground wiring conductors G1 and G2 installed above and below the signal wiring conductors; transmit signals which are inputted and outputted to a semiconductor device connected to the signal wiring conductors S1 and S2 in a stable manner; and to prevent a malfunction of the semiconductor device.

Further, as well as in the case of the multi-layer circuit substrate of first embodiment, the wiring density of the signal wiring conductors will not decrease as observed in the conventional wiring board using a coplanar line structure, and it is possible to meet the densification of the wiring conductors.

Furthermore, the first signal wiring conductor S1 installed in one of the grid line directions and the second signal wiring conductor S2 installed in the other grid line direction, are electrically connected to each other via the through conductor T which passes through the third and fourth insulating layers I3 and I4 and the power wiring conductor P so as to be electrically insulated from the power wiring conductor P. Therefore, a capacity is generated between the power wiring conductor P and the signal wiring conductors, with the result that an increase of the characteristic impedance at the through conductor T due to the inductance component of the through conductor T is suppressed, and a uniform characteristic impedance can be obtained in the whole signal wiring conductors including the through conductor T.

Furthermore, in a fourth aspect of the invention, the aperture area ratio of each grid of the first to third ground wiring conductors G1 to G3 and the power wiring conductor P which are installed in the shapes of grids in the multi-layer circuit substrate according to any one of the first to third aspects of the invention, is set to be 5% to 80%. In that case, delamination and so on will not occur between the insulating layer and the grid wiring conductor, or between the insulating layers interposing the grid wiring conductor; and a strip line structure in which a sufficiently stabilized ground state is ensured with respect to the signal wiring conductors S1 and S2 which are formed between the grid wiring conductors, can be realized. As a result, more preferable signal transmission is realized in a stable manner and a higher reliability as a wiring substrate can be obtained.

In a case where the aperture area ratio of each grid is less than 5%, even when an unreacted gas and a gas of moisture and so on which is absorbed in the manufacturing step are generated from the insulating layers I1 to I5 at the time of heat-treating to cure or baking the insulating layers I1 to I5, it is difficult to preferably volatilize these gases via an aperture portion of the grid wiring conductor, with the result that an accumulation of the gases is likely to be formed to cause a so-called blister in the insulating layers I1 to I5, an interlayer delamination resulting from the blister is likely to occur between the signal wiring conductors S1 and S2, and a break is likely to occur in the signal wiring conductors S1 and S2. On the other hand, in a case where the aperture area ratio of each grid is more than 80%, the line widths of the wiring conductors become narrow, the ground wiring conductors G1 to G3 come to have a large inductance and cannot function as sufficiently stable grounds for the signal wiring conductors S1 and S2, and nonuniformity of the characteristic impedance is likely to occur, with the result that it is likely to cause a reflection and an attenuation of signals, and cause a delamination in the wiring conductors. Therefore, it is preferable to set the aperture area ratio of each grid of the first to third ground wiring conductors G1 to G3 and the power wiring conductor P, to be 5% to 80%.

In a fifth aspect of the invention, the multi-layer circuit substrate according to any one of the first to third aspects of the invention are formed in such a manner that: the first insulating layer I1 formed of a ceramic material is installed so as to serve also as a supporting substrate; then the second to fifth insulating layers I2 to I5 formed of a insulating resin material are laminated on the first insulating layer I1. As a result, a multi-layer circuit substrate especially excellent in a high-frequency characteristic can be obtained. As the ceramic material for forming the first insulating layer I1, for example, alumina ceramics, mullite ceramics, aluminum nitride ceramics and silicon carbide ceramics, and glass ceramics are used. For example, a first insulating layer I1 formed of aluminum ceramics is manufactured by: adding and mixing an appropriate organic binder, solvent, plasticizer, dispersant and so on into material powder of alumina, silica, magnesia, calcia or the like so as to prepare a slurry; making the slurry into ceramic green sheets by a sheet making method such as a doctor blade method; thereafter applying a proper stamping process and a print application of a conductor paste to the ceramic green sheets to laminate the sheets; and baking the sheets at a high temperature.

As the insulating resin material for forming the second to fifth insulating layers I2 to I5, for example, a fluoro resin, a polyimide resin, an epoxy resin, a benzocyclobuten resin, a polynorbornene resin and so on are used. For example, in the case of a second insulating layers I2 formed of a polyimide resin, a resin precursor is applied onto a first insulating layer I1 serving as a supporting substrate by a spin-coating method, and then a heating process is performed, whereby the second insulating layer I2 of a polyimide resin having a thickness of 1 $\mu$m to 20 $\mu$m is manufactured. Also the third to fifth insulating layers I2 to I5 are manufactured in the similar manner. In this case, a through hole at which a through conductor T is formed is formed by a photolithography method.

As the first to third ground wiring conductors G1 to G3 and the first and second signal wiring conductors S1 and S2 and the power wiring conductor P, a metalized wiring layer is used in a case where the insulating layers are made of a material which needs to be baked at a high temperature, and a wiring layer by a conductive paste in a case where the insulating layers are made of a material which does not need to be baked at a high temperature. Further, in either case, it is possible to use a conductor wiring layer by a vapor phase deposition method such as a sputtering method, an evaporating method and an ion-plating method, or a conductor wiring layer by a plating method.

For example, in a case where a metalized wiring layer is used, a metal paste which is obtained by adding and mixing an appropriate organic binder, solvent and plasticizer into refractory metal powder of tungsten, molybdenum, manganese or the like, is print-applied in a specific pattern onto a ceramic green sheet which will become an insulating layer, and the metal paste and the ceramic green sheet are simultaneously baked, with the result that a specific pattern of wiring conductor is adhered and installed onto the insulating layer.

Further, in a case where a conductive paste is used, a conductive paste which is obtained by adding and mixing an appropriate organic binder, solvent and plasticizer into metal powder of copper, silver, gold or the like, is print-applied in a specified pattern onto an insulating layer, and a specific heat process is given, with the result that a specific pattern of wiring conductor is adhered and installed onto the insulating layer.

Still further, in the case of a vapor phase deposition method, a metal thin film of copper, gold, aluminum, chromium or the like is adhered onto an insulating layer by a vapor phase deposition method, and a specific pattern of wiring conductor is formed and installed by a photolithography method.

In a sixth aspect of the invention, in the multi-layer circuit substrate according to the fifth aspect of the invention, each of the first and second signal wiring conductors S1 and S2 installed on the insulating layer formed of an insulating resin material is composed of an adhesive metal layer formed of a metal selected from the group consisting of chromium, titanium, molybdenum and niobium, and a main conductor metal layer formed of a metal selected from the group consisting of copper, silver and gold. Therefore, the main conductor metal layer and the insulating layer are preferably adhered to each other via the adhesive metal layer, and an excellent transmission characteristic of high-frequency signals is achieved.

The good adhesion between the main conductor metal layer and the insulating layer via the adhesive layer is attributed to the fact that in the case where chromium, titanium, molybdenum or niobium is used for the adhesive metal layer, since these metals have high binding energy between oxygen and the binding between these metals and the resin of the insulating film occurs via oxygen atoms, the adhesive layer and the insulating film are preferably adhered to each other.

However, since these metals have comparably high resistance values and deteriorate the transmission characteristic of high-frequency signals, metal having a low resistance value, such as copper, silver, gold or the like is used for the main conductor metal material. As a result, it becomes possible to transmit high-frequency signals mainly by a main conductor metal layer of low resistance and to minimize the effect of the adhesive metal layer on the high-frequency transmission characteristic.

In a seventh aspect of the invention, in the multi-layer circuit substrate of the sixth aspect of the invention, a thickness of the adhesive metal layer is in a range of 0.03 $\mu$m to 0.2 $\mu$m and a thickness of the main conductor layer is in a range of 1 $\mu$m to 10 $\mu$m. In this way, it is preferable that the thickness of the adhesive metal layer is in a range of 0.03 $\mu$m to 0.2 $\mu$m. In the case of less than 0.03 $\mu$m, an effect to enhance the adhesion of the metal conductor layer is not sufficiently high. On the contrary, in the case of more than 0.2 $\mu$m, when a signal of 10 GHz, for example, is transmitted, the thickness of a metal involved in the signal transmission (skin depth) is approximately 0.6 $\mu$m, one-third or more of which is dominated by the adhesive metal layer, with the result that the main conductor metal layer of copper, silver, gold or the like having a low resistance cannot perform in a sufficiently good manner. Further, it is preferable that the thickness of the main conductor metal layer is in a range of 1 $\mu$m to 10 $\mu$m. In the case of less than 1 $\mu$m, the resistance of the wiring conductor is increased, so that it is likely to be difficult to ensure good power distribution to a semiconductor device and a stable ground, and to propagate signals in a good state. On the contrary, in the case of more than 10 $\mu$m, the insulating layer, which is laminated on this main conductor metal layer, cannot cover sufficiently, so that an insulation failure may occur.

The multi-layer circuit substrate of the invention may be laminated further repeating the respective configurations as described above, or may be laminated combining various kinds thereof.

Alternatively, when main conductors of the signal wiring conductors S1 and S2 are made of a metal thin film by a vapor phase deposition method of niobium, the main conductor is in the superconducting state at an operation temperature of 9K or below, and the electric resistance is 0$\Omega$, so that electric signals can be propagated without attenuation.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multi-layer circuit substrate comprising:
   first to fifth insulating layers laminated sequentially,
   the first insulating layer having an upper face on which a first ground wiring conductor is installed in the shape of a grid;
   the second insulating layer having an upper face on which a first signal wiring conductor is installed so as to overlie a wiring conductor in one of grid line directions of the first ground wiring conductor;
   the third insulating layer having an upper face on which a second ground wiring conductor is installed so as to overlie the first ground wiring conductor, the second ground wiring conductor having almost the same grid shape as that of the first ground wiring conductor;
   the fourth insulating layer having an upper face on which a second signal wiring conductor is installed so as to overlie a wiring conductor in the other grid line direction of the first ground wiring conductor;
   the fifth insulating layer having an upper face on which a third ground wiring conductor is installed so as to overlie the first ground wiring conductor, the third ground wiring conductor having almost the same grid shape as that of the first ground wiring conductor,
   wherein a line width of the first signal wiring conductor is equal to or narrower than line widths of the first and second ground wiring conductors, and a line width of the second signal wiring conductor is equal to or narrower than line widths of the second and third ground wiring conductors, and
   wherein the first signal wiring conductor and the second signal wiring conductor are connected to each other via a through conductor which passes through the third and fourth insulating layers and the second ground wiring conductor so as to be insulated from the second ground wiring conductor.

2. A multi-layer circuit substrate comprising:
   first to fourth insulating layers laminated sequentially,
   the first insulating layer having an upper face on which a first ground wiring conductor is installed in the shape of a grid;
   the second insulating layer having an upper face on which a first signal wiring conductor is installed so as to overlie a wiring conductor in one of grid line directions of the first ground wiring conductor;
   the third insulating layer having an upper face on which a second signal wiring conductor is installed so as to overlie a wiring conductor in the other grid line direction of the first ground wiring conductor;
   the fourth insulating layer having an upper face on which a second ground wiring conductor is installed so as to overlie the first ground wiring conductor, the second ground wiring conductor having almost the same grid shape as that of the first ground wiring conductor,
   wherein line widths of the first and second signal wiring conductors are equal to or narrower than line widths of the first and second ground wiring conductors, and
   wherein the first signal wiring conductor and the second signal wiring conductor are connected to each other via a through conductor which passes through the third insulating layer.

3. A multi-layer circuit substrate comprising:
   first to fifth insulating layers laminated sequentially,
   the first insulating layer having an upper face on which a first ground wiring conductor is installed in the shape of a grid;
   the second insulating layer having an upper face on which a first signal wiring conductor is installed so as to overlie a wiring conductor in one of grid line directions of the first ground wiring conductor;
   the third insulating layer having an upper face on which a power wiring conductor is installed so as to overlie the first ground wiring conductor, the power wiring conductor having almost the same grid shape as that of the first ground wiring conductor;
   the fourth insulating layer having an upper face on which a second signal wiring conductor is installed so as to overlie a wiring conductor in the other grid line direction of the first ground wiring conductor;

the fifth insulating layer having an upper face on which a second ground wiring conductor is installed so as to overlie the first ground wiring conductor, the second ground wiring conductor having almost the same grid shape as that of the first ground wiring conductor, wherein a line width of the first signal wiring conductor is equal to or narrower than line widths of the first ground wiring conductor and the power wiring conductor, and a line width of the second signal wiring conductor is equal to or narrower than line widths of the power wiring conductor and the second ground wiring conductor, and wherein the first signal wiring conductor and the second signal wiring conductor are connected to each other via a through conductor which passes through the third and fourth insulating layers and the power wiring conductor so as to be insulated from the power wiring conductor.

4. The multi-layer circuit substrate of any one of claims 1 to 3, wherein aperture area ratios of respective grid of the first to third ground wiring conductors and the power wiring conductor which are installed in shapes of grids, are in a range of 5% to 80%.

5. The multi-layer circuit substrate of any one of claims 1 to 3, wherein the first insulating layer is formed of a ceramic material, and the other insulating layers are formed of a resin material.

6. The multi-layer circuit substrate of claim 5, wherein each of the first and the second signal wiring conductors are composed of an adhesive metal layer formed of a metal selected from the group consisting of chromium, titanium, molybdenum and niobium, and a main conductor metal layer formed of a metal selected from the group consisting of copper, silver and gold.

7. The multi-layer circuit substrate of claim 6, wherein a thickness of the adhesive metal layer is in a range of 0.03 $\mu$m to 0.2 $\mu$m and a thickness of the main conductor metal layer is in a range of 1 $\mu$m to 10 $\mu$m.

* * * * *